United States Patent
Watai

(10) Patent No.: US 7,795,978 B2
(45) Date of Patent: Sep. 14, 2010

(54) PROGRAMMABLE GAIN CIRCUIT AND AMPLIFICATION CIRCUIT

(75) Inventor: Takahiro Watai, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/234,227

(22) Filed: Sep. 19, 2008

(65) Prior Publication Data
US 2009/0079501 A1 Mar. 26, 2009

(30) Foreign Application Priority Data
Sep. 25, 2007 (JP) .............................. 2007-247673

(51) Int. Cl.
*H03G 3/12* (2006.01)
(52) U.S. Cl. ....................................... 330/282; 330/254
(58) Field of Classification Search ................. 330/282, 330/254, 51, 279
See application file for complete search history.

(56) References Cited

U.S. PATENT DOCUMENTS

| | | | | |
|---|---|---|---|---|
| 5,245,229 | A * | 9/1993 | Colvin, Sr. | 327/361 |
| 6,549,075 | B1 * | 4/2003 | Zhang | 330/282 |
| 7,057,454 | B2 * | 6/2006 | Ma et al. | 330/86 |

FOREIGN PATENT DOCUMENTS

| JP | 56-028524 A | 3/1981 |
|---|---|---|
| JP | 60-236509 A | 11/1985 |

* cited by examiner

*Primary Examiner*—Henry K Choe
(74) *Attorney, Agent, or Firm*—Arent Fox LLP

(57) ABSTRACT

One aspect of the embodiments relates to a programmable gain circuit including an amplification unit amplifying an input signal, an input resistor coupled to an input terminal of the amplification unit, a feedback resistor coupled between an output terminal of the amplification unit and the input terminal of the amplification unit, a first switch switching a resistance value of the feedback resistor, a second switch switching a resistance value of the input resistor, and a control unit controlling the second switch such that the second switch switches the resistance value of the input resistor when the first switch switches the resistance value of the feedback resistor.

8 Claims, 11 Drawing Sheets

FIG. 7

| No | INPUT (EXTERNAL SIGNAL) | | | FOR FEEDBACK RESISTOR SELECTION | | | FOR INPUT RESISTOR CORRECTION SELECTION | | | GAIN |
|---|---|---|---|---|---|---|---|---|---|---|
|  | A3 | A2 | A1 | B3 | B2 | B1 | C1 | C2 | C3 |  |
| 1 | 0 | 0 | 0 | 1 | 1 | 1 | 0 | 0 | 1 | R2/R1 |
| 2 | 0 | 0 | 1 | 1 | 1 | 0 | 0 | 1 | 0 | (R2+X)/R1 |
| 3 | 0 | 1 | 0 | 1 | 0 | 1 | 0 | 1 | 0 | (R2+2X)/R |
| 4 | 0 | 1 | 1 | 1 | 0 | 0 | 1 | 0 | 0 | (R2+2X+X)/R1 |
| 5 | 1 | 0 | 0 | 0 | 1 | 1 | 0 | 1 | 0 | (R2+4X)/R1 |
| 6 | 1 | 0 | 1 | 0 | 1 | 0 | 1 | 0 | 0 | (R2+4X+X)/R1 |
| 7 | 1 | 1 | 0 | 0 | 0 | 1 | 1 | 0 | 0 | (R+4X+2X)/R1 |
| 8 | 1 | 1 | 1 | 0 | 0 | 0 | 0 | 0 | 0 | (R2+4X+2X+X)/R1 |

PROGRAMMABLE GAIN CIRCUIT AND AMPLIFICATION CIRCUIT

CROSS-REFERENCE TO RELATED APPLICATIONS

This application claims the benefit of priority of Japanese Patent Application No. 2007-247673 filed on Sep. 25, 2007, the entire contents of which are incorporated herein by reference.

BACKGROUND

1. Field

The present application relates to a programmable gain circuit and an amplification circuit.

2. Description of the Related Art

FIG. 1 illustrates a typical programmable gain circuit. A gain of the typical programmable gain circuit may be adjusted by switching operations of switching circuits 200.

As shown in FIG. 1, an input signal IN is inputted to one input terminal of an amplifier 100. An output signal OUT is outputted from an output terminal of the amplifier 100. A reference voltage VS is supplied to the output terminal of the amplifier 100 via a plurality of resistors Rs. Electric potentials of electrical connection points between respective resistors Rs become electric potentials obtained by dividing an electric potential difference between a voltage of the output signal OUT and the reference voltage Vs based on resistance values of respective resistors Rs.

As further shown in FIG. 1, the other input terminal of the amplifier 100 is coupled to the electrical connection points between respective resistors Rs via a plurality of switching circuits 200. The plurality of switching circuits 200 are controlled such that any one of the switching circuits 200 becomes conductive. When any one of the plurality of switching circuits 200 selectively becomes conductive, a voltage inputted to the other input terminal of the amplifier 100 may be adjusted. A gain of the amplifier 100 may be adjusted based on the adjustment of the voltage inputted to the other input terminal of the amplifier 100.

For example, if the switching operations of the plurality of switching circuits 200 are controlled with a three-bit control signal in the typical programmable gain circuit in FIG. 1, there may be three selectable gains.

Consequently, if a fine adjustment of the gain is required, the requirement causes an increase in the number of resistors and switching circuits. Moreover, the requirement causes an increase in the number of bits of the control signal that controls the plurality of switching circuits.

There are an N number of gains that may be selected with an N-bit control signal, in the typical programmable gain circuit in FIG. 1. The typical programmable gain circuit in FIG. 1 requires, for the fine adjustment of the gain, a control circuit that generates a multi-bit control signal, the switching circuits, and the resistors, wherein the number of the switching circuits and the number of the resistors are equal to the number of bits of the control signal. Consequently, there is a problem that an increase in circuit size is caused in the typical programmable gain circuit in FIG. 1.

FIG. 2 illustrates another typical programmable gain circuit.

As shown in FIG. 2, an input signal IN is inputted to one input terminal of an amplifier 300 via an input resistor R100. A reference voltage Vs is inputted to the other input terminal of the amplifier 300. An output signal OUT is outputted from an output terminal of the amplifier 300. The output terminal of the amplifier 300 is coupled to the one input terminal via a plurality of feedback resistors R200 to R500. For example, resistance values of the resistors R300 to R500 are set in the ratio of 1 to 2 to 4 (1:2:4).

As further shown in FIG. 2, switching circuits SW100 to SW300 are coupled in parallel to each of the resistor R300 to R500. The switching circuits SW100 to SW300 are switching-controlled based on a three-bit control signal. Since resistance values of the feedback resistors R200 to R500 may be adjusted in eight levels by the switching-control of the switching circuits SW100 to SW300, a gain of the amplifier 300 may be adjusted in eight levels with the three-bit control signal.

The gain is adjusted in 2N levels with an N-bit control signal in another typical programmable gain circuit in FIG. 2. In another typical programmable gain circuit in FIG. 2, a precise adjustment of the gain is very difficult due to ON-resistances of the respective switching circuits that affect the gain.

FIG. 3 illustrates a typical inverting amplification circuit. A gain G of the inverting amplification circuit is represented by Equation (1) if an input resistor is R600 and a feedback resistor is R700.

$$G = OUT/IN = R700/R600 \qquad (1)$$

That is to say, the gain G is represented as a ratio of a resistance value of the input resistor R600 to a resistance value of the feedback resistor R700.

As shown in FIG. 4, a feedback resistor R800, to which a switching circuit SW400 is coupled in parallel, is coupled in series to a feedback resistor R700 for an adjustment of a gain G. If the switching circuit SW400 becomes conductive and an ON-resistance in the aforementioned conductive state is represented as RSW400, the gain G is represented by Equation (2).

$$G = OUT/IN = (R700 + RSW400)/R6 \qquad (2)$$

That is to say, the ON-resistance RSW400 of the switching circuit SW400 affects the gain G.

An amplification circuit discussed in Japanese Laid-open Patent Publication No. 1985-236509 is the amplification circuit which selects one of N level(s) in gain with an N-bit control signal. An amplifier discussed in Japanese Laid-open Patent Publication No. 1981-28524 corresponds to multiple input signals by switching feedback resistors and input resistors of the amplifier with analog switches. However, the number of the selectable feedback resistors and input resistors is equal to the number of the analog switches.

Consequently, it is very difficult to perform the fine adjustment of the gain even if the gain is selected by selection of the feedback resistor and the input resistor.

SUMMARY

One aspect of the embodiments relates to a programmable gain circuit including an amplification unit amplifying an input signal, an input resistor coupled to an input terminal of the amplification unit, a feedback resistor coupled between an output terminal of the amplification unit and the input terminal of the amplification unit, a first switch switching a resistance value of the feedback resistor, a second switch switching a resistance value of the input resistor, and a control unit controlling the second switch such that the second switch switches the resistance value of the input resistor when the first switch switches the resistance value of the feedback resistor.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 7 illustrates an operation of the control circuit in FIG. 6.

DETAILED DESCRIPTION OF THE EMBODIMENTS

Figure 1:
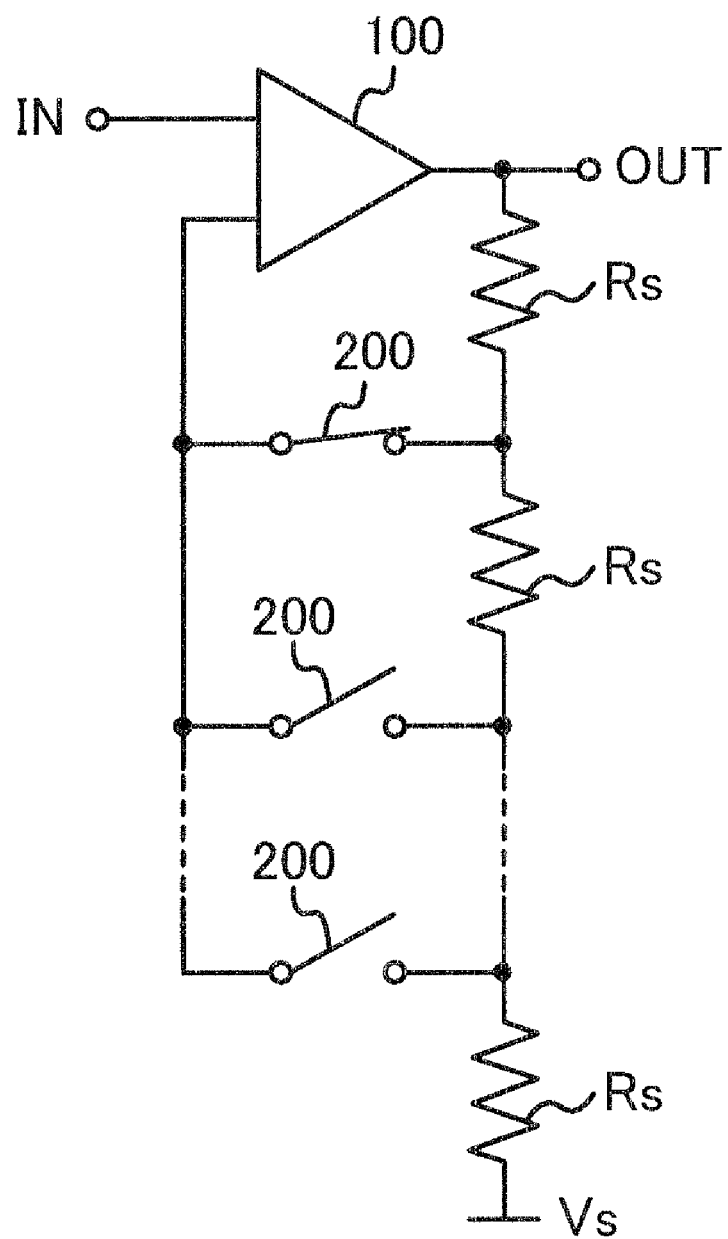
FIG. 1 illustrates a circuit diagram of a conventional embodiment.
Figure 2:
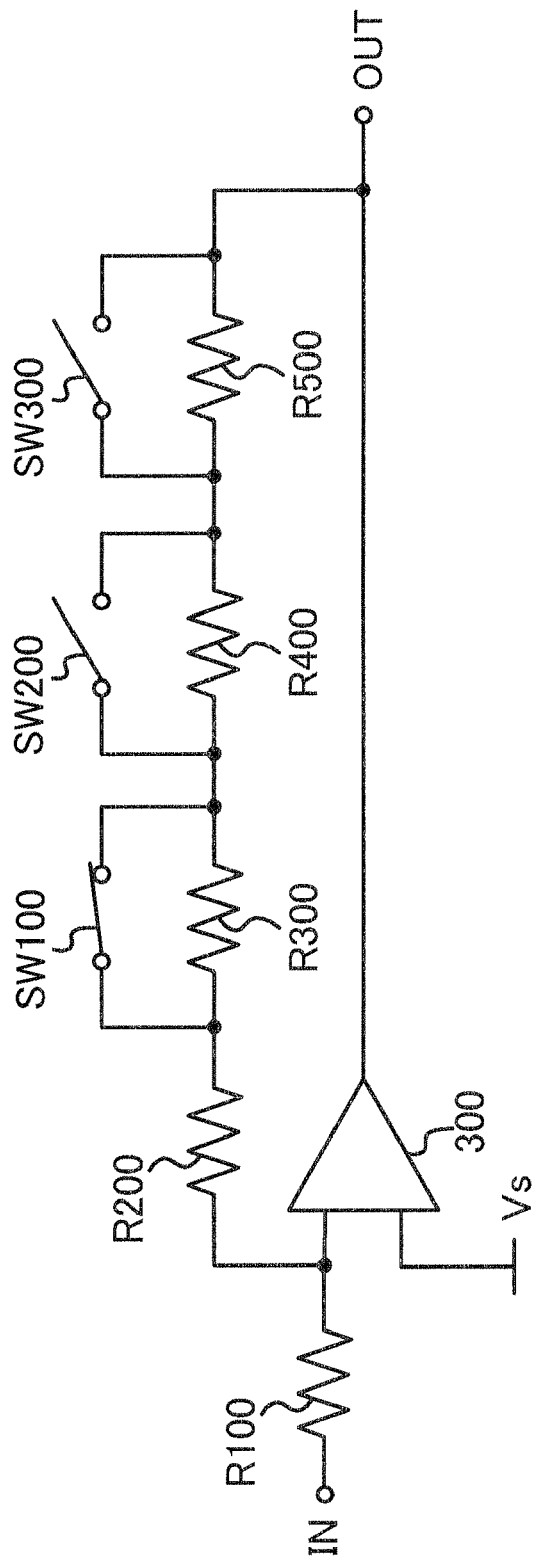
FIG. 2 illustrates a typical programmable gain circuit.
Figure 3:
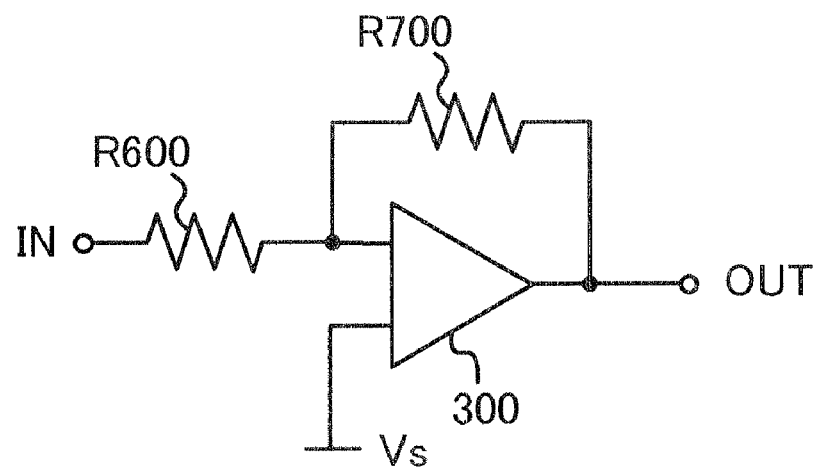
FIG. 3 illustrates a typical inverting amplification circuit.
Figure 4:
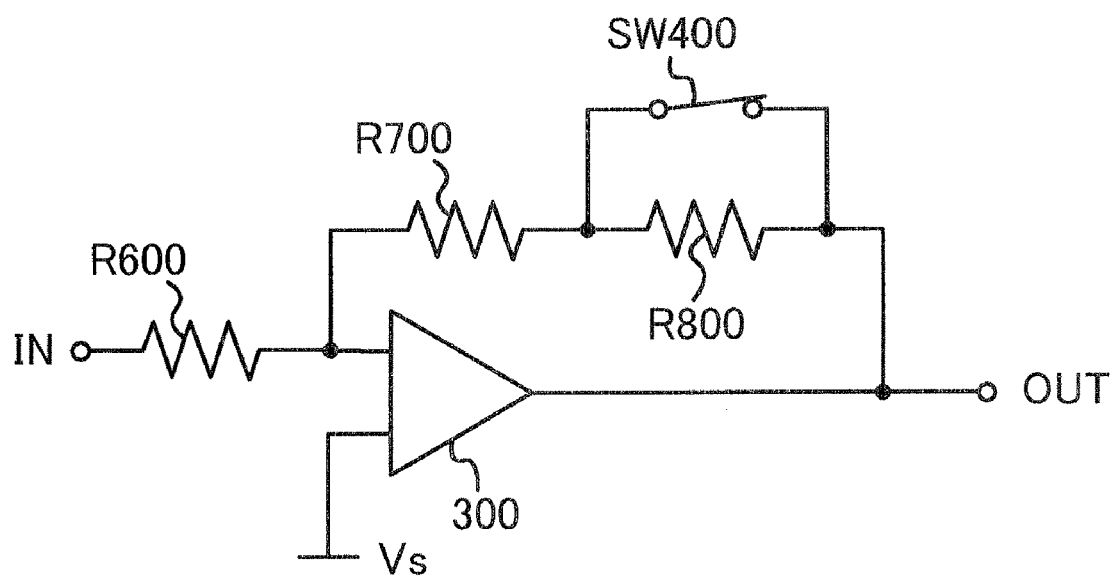
FIG. 4 illustrates another typical programmable gain circuit.
Figure 5:
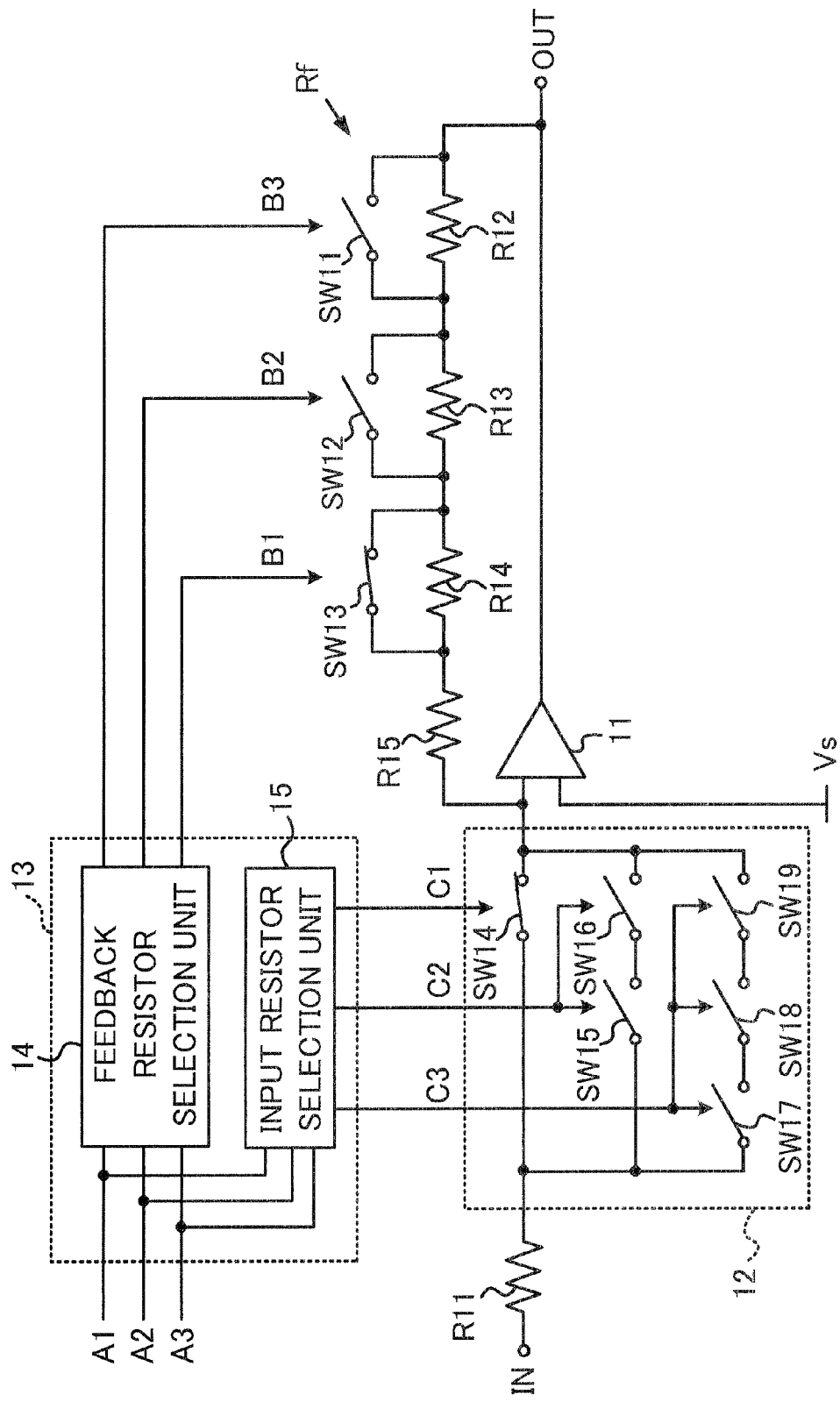
FIG. 5 illustrates a first embodiment.

FIG. 5 illustrates a first embodiment.
As shown in FIG. 5, an input signal IN is input to one input terminal of an amplifier 11 via an input resistor R11 and a group of switching circuits 12. A reference voltage Vs is input to the other input terminal of the amplifier 11.

As further shown in FIG. 5, an output signal OUT is output from an output terminal of the amplifier 11. The output terminal of the amplifier 11 is coupled to the one input terminal via a feedback resistor unit Rf. The feedback resistor unit Rf includes a plurality of feedback resistors R12 to R15 coupled in series and switching circuits (first switching circuits) SW11 to SW13 which may be used for adjusting a gain and be respectively coupled in parallel to the resistors R12 to R14.

For example, resistance values of the resistors R12 to R14 that are set are in the ratio of 4 to 2 to 1 (4:2:1). The switching circuits SW11 to SW13 are respectively and independently switching-controlled based on three-bit control signals B1 to B3 output from a control circuit 13. The switching circuits SW11 to SW13 become conductive when the control signals B1 to B3 that are inputted are in an H level, and, on the other hand, the switching circuits SW11 to SW13 become non-conductive when the control signals B1 to B3 that are inputted are in an L level.

When the switching circuits SW11 to SW13 are switching-controlled based on the three-bit control signals, resistance values of the feedback resistors R12 to R15 may be adjusted in eight levels. That is to say, when the switching circuits SW11 to SW13 are switching-controlled based on the three-bit control signals, a gain of the amplifier 11 may be adjusted.

As further shown in FIG. 5, a switching circuit SW14, switching circuits SW15 and SW16 coupled in series, and switching circuits SW17 to SW19 coupled in series are coupled in parallel in the group of switching circuits 12.

As further shown in FIG. 5, the switching circuit SW14 is switching-controlled based on a control signal C1 output from the control circuit 13. The switching circuits SW15 and SW16 are switching-controlled based on a control signal C2 output from the control circuit 13. The switching circuits SW17 to SW19 are switching-controlled based on a control signal C3 output from the control circuit 13. Respective switching circuits SW14 to SW19 become conductive when the control signals C1 to C3 are in an H level, and on the other hand, the switching circuits SW14 to SW19 become non-conductive when the control signals C1 to C3 are in an L level.

The control circuit 13 in FIG. 5 generates the control signals BE to B3 and C1 to C3 based on three-bit input signals A1 to A3 that are inputted.

Figure 6:
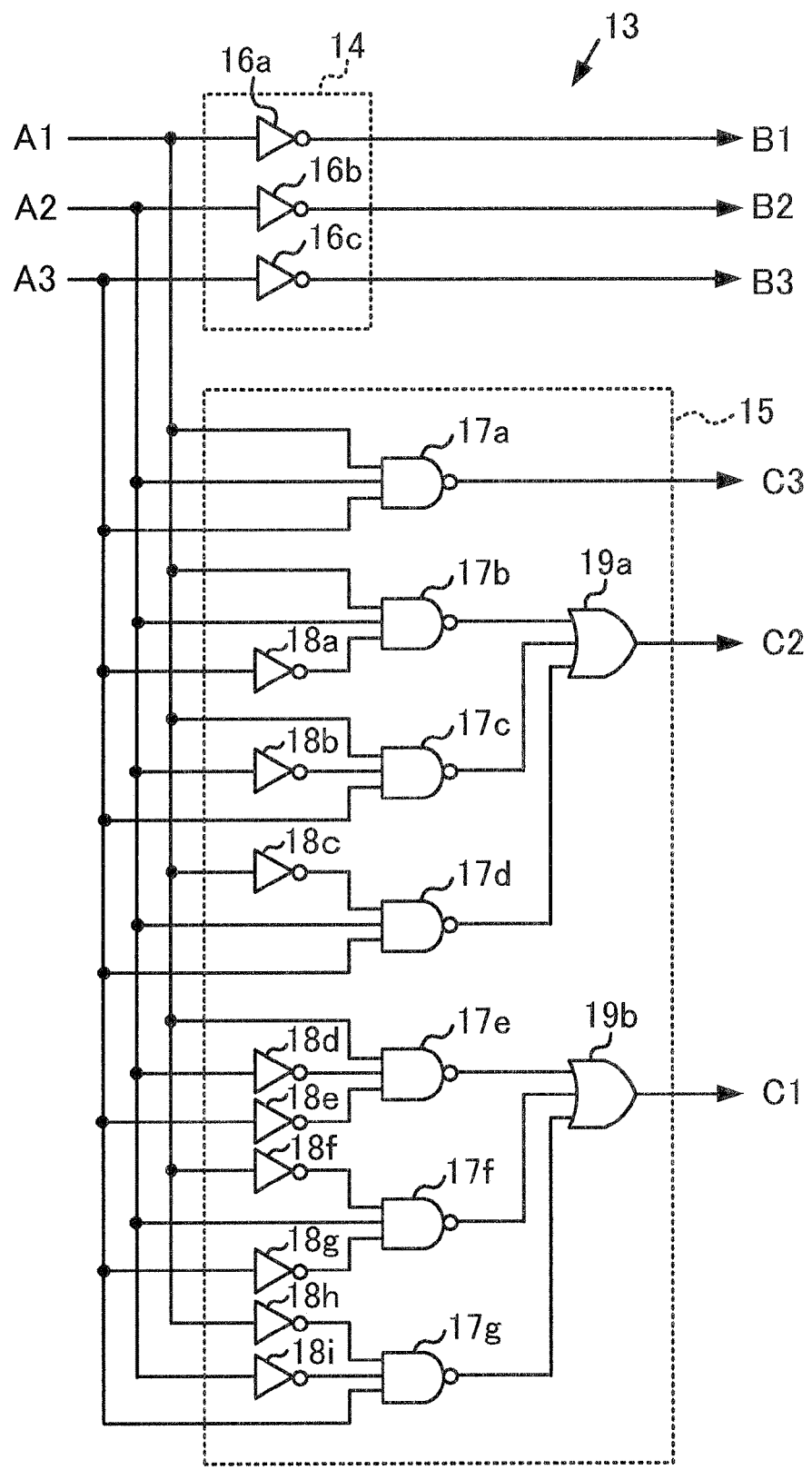
FIG. 6 illustrates a control circuit in FIG. 5.

FIG. 6 illustrates the control circuit in FIG. 5. The control circuit 13 in FIG. 6 includes a feedback resistor selection unit 14, which generates the control signals B1 to B3, and an input resistor selection unit 15, which generates the control signals C1 to C3. The feedback resistor selection unit 14 outputs the control signals B1 to B3 by inverting each of the input signals A1 to A3 by inverter circuits 16a to 16c.

As shown in FIG. 6, the input signals A1 to A3 are inputted to a NAND circuit 17a, and the NAND circuit 17a outputs the control signal C3.

The input signals A1 and A2, and a signal obtained by inverting the input signal A3 by an inverter circuit 18a are inputted to a NAND circuit 17b. The input signals A1 and A3, and a signal obtained by inverting the input signal A2 by an inverter circuit 18b are inputted to a NAND circuit 17c. The input signals A2 and A3, and a signal obtained by inverting the input signal A1 by an inverter circuit 18c are inputted to a NAND circuit 17d.

As further shown in FIG. 6, output signals from the NAND circuits 17b to 17d are inputted to an OR circuit 19a, and the OR circuit 19a outputs the control signal C2. The input signal A1, a signal obtained by inverting the input signal A2 by an inverter circuit 18d, and a signal obtained by inverting the input signal A3 by an inverter circuit 18e, are inputted to a NAND circuit 17e.

The input signal A2, a signal obtained by inverting the input signal A1 by an inverter circuit 18f, and a signal obtained by inverting the input signal A3 by an inverter circuit 18g, are inputted to a NAND circuit 17f.

The input signal A3, a signal obtained by inverting the input signal A1 by an inverter circuit 18h, and a signal obtained by inverting the input signal A2 by an inverter circuit 18i, are inputted to a NAND circuit 17g.

As further shown in FIG. 6, output signals from the NAND circuits 17e to 17g are inputted to an OR circuit 19b, and the OR circuit 19b outputs the control signal C1. FIG. 7 illustrates operations of the control circuit 13 in FIG. 6. Since the control signals B1 to B3 become the H level when the input signals A1 to A3 are at an L level, all the switching circuits SW11 to SW13 become conductive. Since the control signal C3 becomes the H level when the input signals A1 to A3 are at the L level, the switching circuits SW17 to SW19 become conductive. Since the control signals C1 and C2 become the L level when the input signals A1 to A3 are at the L level, the switching circuits SW14 to SW16 become non-conductive.

As shown in FIG. 7, when control signal A1 is an H level, control signal A2 is an L level, and control signal A3 is an L level, control signal B1 becomes an L level, control signal B2 becomes an H level, and control signal B3 becomes an H level. Thus, switching circuit SW13 becomes non-conductive and switching circuits SW12 and SW11 become conductive. When control signal A1 is an H level, control signal A2 is an L level, and control signal A3 is an L level, control signal C2 becomes an H level, control signal C1 becomes an L level, and control signal C3 becomes an L level. Thus, switching circuits SW15 and SW16 become conductive and switching circuits SW14 and SW17 to SW19 become non-conductive.

As further shown in FIG. 7, when control signal A1 is an H level, control signal A2 is an H level, and control signal A3 is an L level, control signal B1 becomes an L level, control signal B2 becomes an L level, and control signal B3 becomes an H level. Thus, switching circuit SW11 becomes conductive and switching circuits SW12 and SW13 become non-conductive. When control signal A1 is an H level, control signal A2 is an H level, and control signal A3 is an L level, control signal C1 becomes an H level, control signal C2 becomes an L level, and control signal C3 becomes an L level. Thus, switching circuit SW14 becomes conductive and switching circuits SW15 to SW19 become non-conductive.

As further shown in FIG. 7, since the control signal C1 is an H level when one of the switching circuits SW11 to SW13 becomes conductive, the one switching circuit SW14 becomes conductive. Since the control signal C2 is an H level when two of the switching circuits SW11 to SW13 become conductive, the two switching circuits SW15 and SW16 become conductive.

Since the control signal C3 is an H level when all the switching circuits SW11 to SW13 become conductive, the three switching circuits SW17 to SW19 become conductive.

Consequently, in the group of switching circuits 12 in FIG. 5, the number of switching circuits that become conductive among the switching circuits SW11 to SW13 becomes equal to the number of switching circuits coupled in series to one input terminal of the amplifier 11. As further shown in FIG. 7, when all the control signals B1 to B3 are an L level, all the control signals C1 to C3 are an L level. Since all the switching circuits SW14 to SW19 in the group of switching circuits 12 become non-conductive when all the control signals B1 to B3 are an L level, a state is entered in which the input signal IN is not inputted to the amplifier 11. Consequently, the number of levels in adjustable gain range is seven levels in the first embodiment in FIG. 5, except for the case where all the switching circuits SW11 to SW13 become non-conductive.

Figure 8:
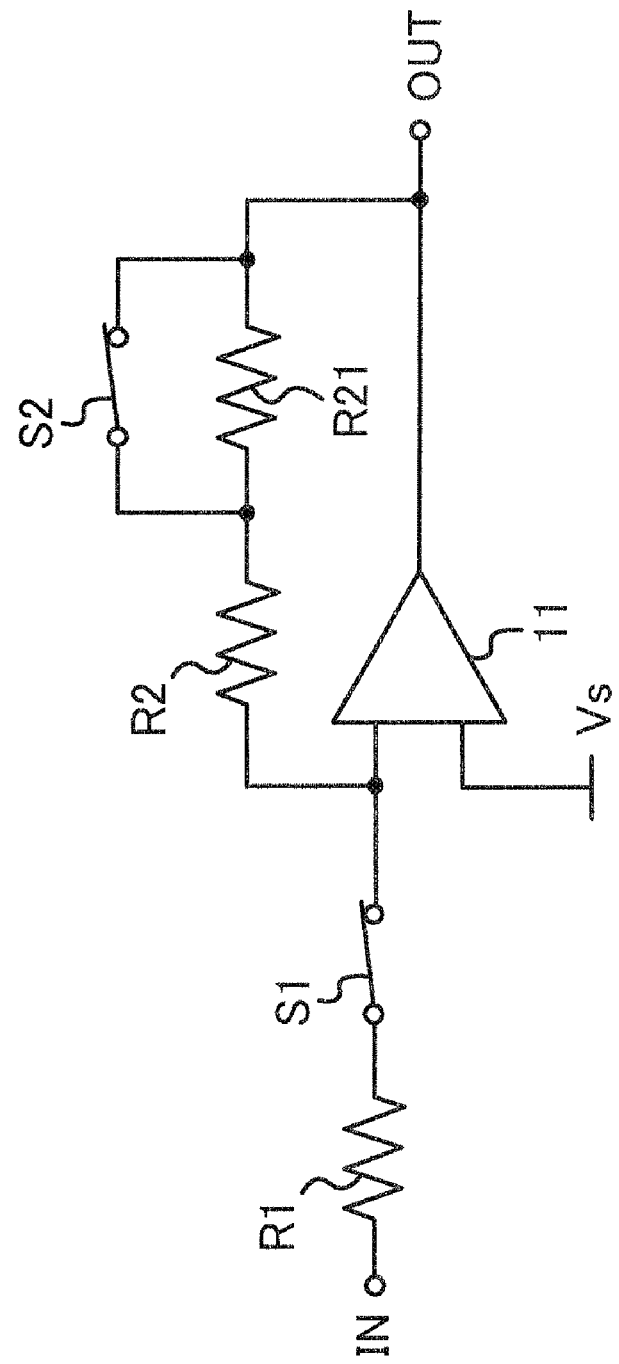
FIG. 8 illustrates one aspect of the first embodiment of FIG. 5.

FIG. 7 illustrates a substantial gain corresponding to respective control signals when a resistance value of the resistor R14 is X, a resistance value of the resistor R13 is 2X, and a resistance value of the resistor R12 is 4X. Hereinafter, the gain of an inverting amplification circuit related to the first embodiment when a switching circuit is added to the group of switching circuits 12 of FIG. 5 will be disclosed according to FIG. 8. As shown in FIG. 8, a switching circuit S1 is coupled between an input resistor R1 and the amplifier 11, and a switching circuit S2 is coupled to a resistor R21 coupled in series to a feedback resistor R2. If ON-resistances of the respective switching circuits S1 and S2 are represented as Ron1 and Ron2 respectively, a gain of the inverting amplification circuit is represented by Equation (3).

$$G = (R2 + Ron2)/(R1 + Ron1) \quad (3)$$

Here, a ratio of the ON-resistance Ron1 of the switching circuit S1 to ON-resistance Ron2 of the switching circuit S2 is set as follows:

$$Ron1/Ron2 \approx R2/R1 \quad (4)$$

Under Equation (4), the gain of the inverting amplification circuit is represented by Equation (5).

$$\begin{aligned}
G &\approx (R2 + Ron1 * R2/R1)/(R1 + Ron1) \quad (5)\\
&= (R2 * R1 + Ron1 * R2)/(R1 * R1 + R1 * Ron1)\\
&= (R2(R1 + Ron1))/(R1(R1 + Ron1))\\
&= R2/R1
\end{aligned}$$

Consequently, the ON-resistance Ron1 cancels an influence of the ON-resistance Ron2 when setting the ratio of the ON-resistance Ron1 and the ON-resistance Ron2 as disclosed above.

In the programmable gain circuit in FIG. 5, the ON-resistances of the switching circuits SW11 to SW13 are set such that the ON-resistances of the switching circuits SW11 to SW13 have the same resistance values. Furthermore, a ratio of the ON-resistances of the switching circuits SW11 to SW13 to ON-resistances of switching circuits (second switching circuits) SW14 to SW19 for adjusting ON-resistances of the group of switching circuits 12 is set such that the ratio is substantially equal to a ratio of the feedback resistor R15 to the input resistor R11.

In the programmable gain circuit in FIG. 5, since the number of switching circuits that become conductive among the switching circuits SW11 to SW13 becomes equal to the number of switching circuits coupled in series to the one input terminal of the amplifier 11, the group of switching circuits 12 cancels an influence of the ON-resistances of the switching circuits SW11 to SW13.

The programmable gain circuit in FIG. 5 is summarized as follows:

(1) The switching circuits SW11 to SW13 are respectively coupled in parallel to the three resistors R12 to R14 among the four feedback resistors R12 to R15 that are coupled in series. Since respective switching circuits SW11 to SW13 are switchable, for example, seven levels of gains may be selected.

(2) Since the resistance values of the feedback resistors R12 to R14 may be set in the ratio of 4 to 2 to 1 (4:2:1) for example, the gain changes substantially in a linear manner by selection of switching operations of respective switching circuits SW11 to SW13.

(3) The group of switching circuits 12 coupled in series to the input resistor R11 cancels the influence of the ON-resistances of the switching circuits SW11 to SW13 that select the resistance values of the feedback resistors R12 to R15. Consequently, the influence of the ON-resistances of the switching circuits SW11 to SW13 on the gain may be prevented, whereby the gain may be precisely adjusted.

(4) The ON-resistances of the switching circuits SW14 to SW19 cancel the influence of the ON-resistances of the switching circuits SW14 to SW19 by setting ON-resistance values of the respective switching circuits SW14 to SW19 in the group of switching circuits 12 to a value obtained by multiplying ON-resistance values of the switching circuits SW11 to SW13, which select feedback resistance values, by a reciprocal of the gain.

(5) The influence of the ON-resistances of the switching circuits SW11 to SW13 is cancelled by selecting from the group of switching circuits 12 the same number of switching circuits as the number of switching circuits that become conductive among the switching circuits SW11 to SW13.

Figure 9:
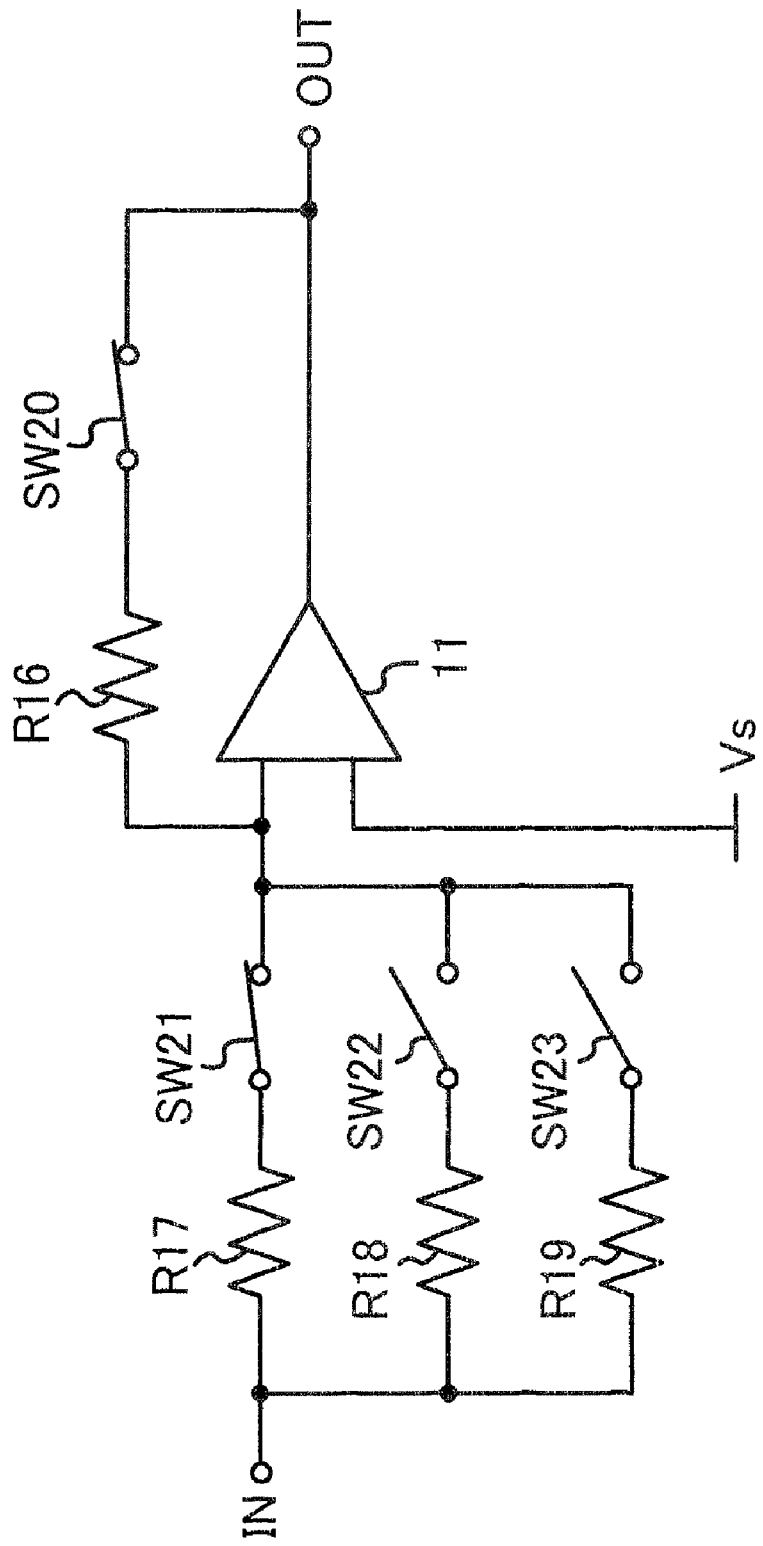
FIG. 9 illustrates a second embodiment.

FIG. 9 illustrates a second embodiment. A switching circuit SW20 is coupled in series to a feedback resistor R16 and the switching circuit SW20 is in a constant conductive state.

As shown in FIG. 9, an input signal IN is input to three input resistors R17 to R19 coupled in parallel. The respective input resistors R17 to R19 are coupled to an input terminal of an amplifier 11 via each of switching circuits SW21 to SW23 included in a group of switching circuits.

Different resistance values are set for the respective input resistors R17 to R19. Any one of the switching circuits SW21 to SW23 is selected and the selected switching circuit becomes conductive. ON-resistance values of the respective switching circuits SW21 to SW23 are set to a value obtained by multiplying a reciprocal of a gain, which is set based on the input resistor coupled to the selected switching circuit and a feedback resistor R16, by a resistance value of the switching circuit SW20.

A programmable gain circuit in FIG. 9 selects any one of the switching circuits SW21 to SW23 and causes one of the selected switching circuits SW21 to SW23 to become conductive, whereby any one of the input resistors R17 to R19 is selected and coupled to the amplifier 11. As a result, the gain is set based on the selected input resistor and the feedback resistor R16.

An ON-resistance of the selected switching circuit among the switching circuits SW21 to SW23 cancels an influence of an ON-resistance of the switching circuit SW20 coupled to the feedback resistor R16.

Any one of the input resistors R17 to R19 is selected by selecting any one of the switching circuits SW21 to SW23 in the programmable gain circuit in FIG. 9. The gain may be switched in three levels by switching the input resistors and this allows an adjustable range of the gain to be increased based on settings of resistance values of the input resistors R17 to R19.

Figure 10:
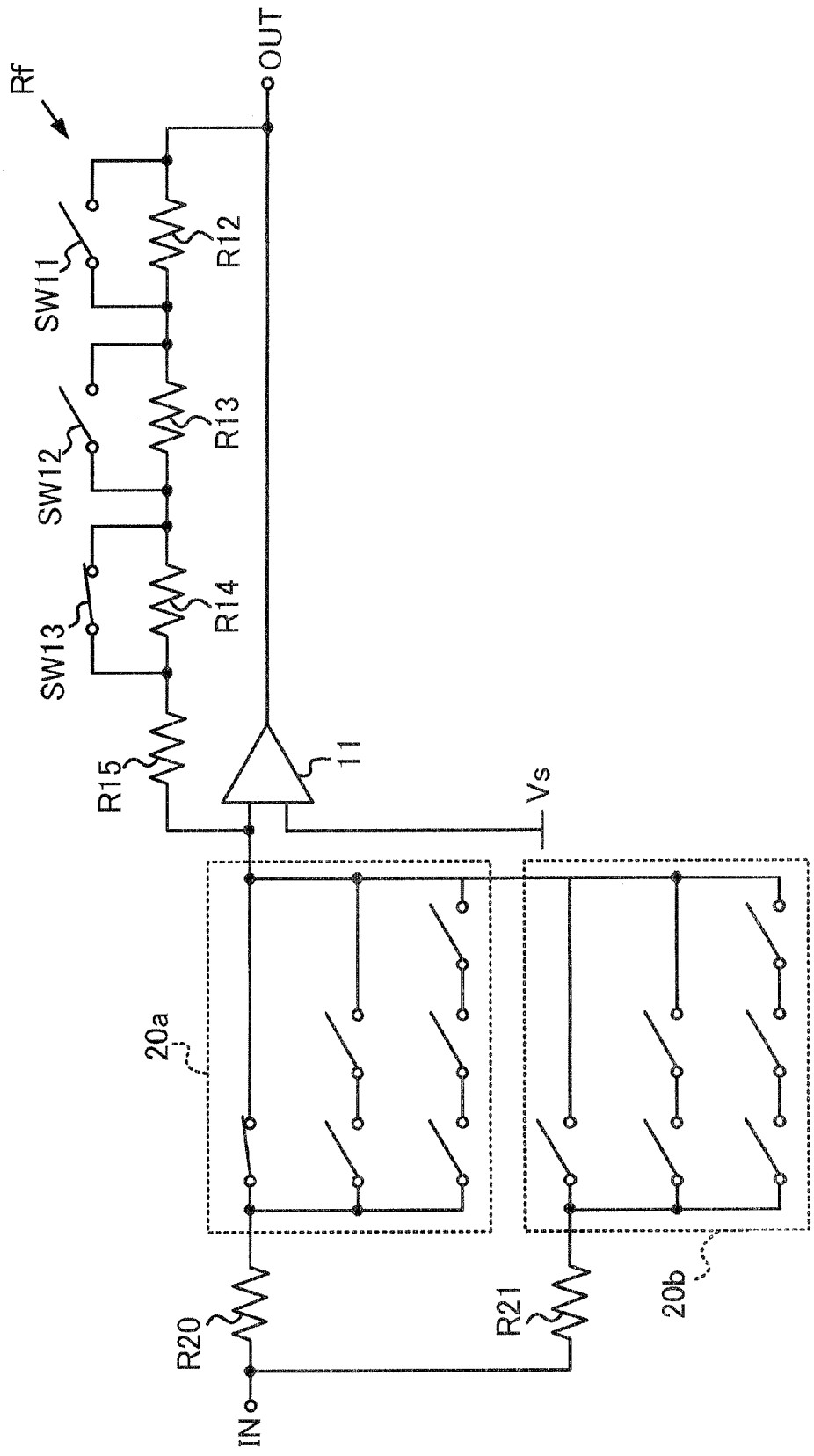
FIG. 10 illustrates a third embodiment.

ON-resistances of the switching circuits SW21 to SW23 coupled to the input resistors R17 to R19 cancel the influence of the ON-resistance of the switching circuit SW20 coupled to the feedback resistor R16. Consequently, the gain may be precisely adjusted. FIG. 10 illustrates a third embodiment. In the third embodiment, a configuration selecting an input resistor is added to the first embodiment. The same reference symbols are given to the same elements as those shown in the first embodiment in FIG. 5.

As shown in FIG. 10, a configuration of a feedback resistor unit Rf is the same as that of the first embodiment. An input signal IN is input to two input resistors R20 and R21. Each of the input resistors R20 and R21 is coupled to an amplifier 11 via groups of switching circuits (third switching circuits) 20a and 20b, respectively. Each of the groups of switching circuits 20a and 20b has the same configuration as the group of the switching circuits 12 in the first embodiment. Any one of the input resistors R20 and R21, that is to say, any one of the groups of the switching circuits 20a and 20b, is selected so as to be controlled in the same manner as the group of switching circuits 12 in the first embodiment. Respective switching circuits in the group of switching circuits that are not selected become non-conductive.

When input resistor R20 is selected, switch circuit group 20a is controlled so that the number of switch circuits in a conductive state becomes the same number of switch circuits in a conductive state in the feedback resistor unit Rf.

When input resistor R21 is selected, switch circuit group 20b is controlled so that the number of switch circuits in a conductive state becomes the same number of switch circuits in a conductive state in the feedback resistor unit Rf. In the third embodiment in FIG. 10, an adjustable range of a gain may further be increased by switching the input resistors R20 and R21.

Figure 11:
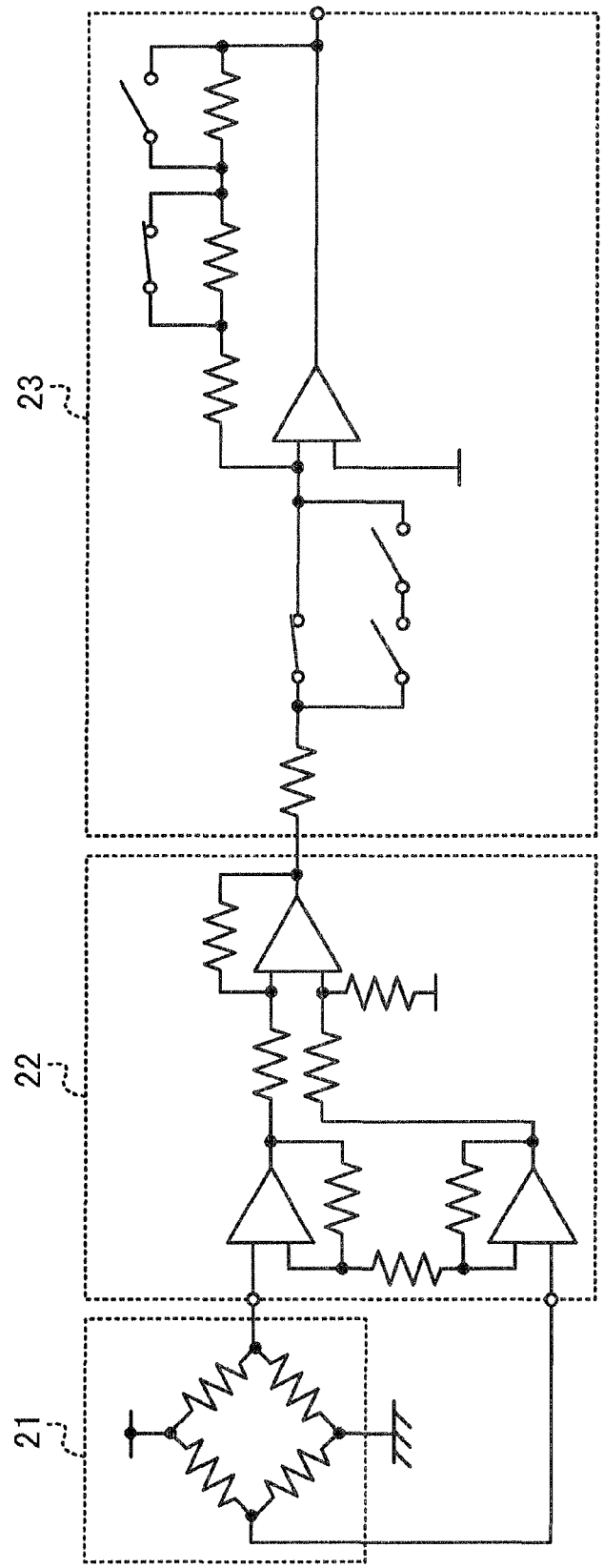
FIG. 11 illustrates a fourth embodiment.

FIG. 11 illustrates a fourth embodiment. The fourth embodiment is an example in which a programmable gain circuit of the aforementioned embodiments may be applied to a sensor detection circuit.

As shown in FIG. 11, the sensor detection circuit includes a sensor element 21, a differential amplification stage 22, and an output stage 23.

An output signal from the sensor element 21 is amplified by the differential amplification stage 22 and the output stage 23, and the output signal is outputted. For example, the output stage 23 may basically have the same configuration as the programmable gain circuit in the first embodiment. The programmable gain circuit in FIG. 11 has a configuration in which switching circuits are coupled in parallel to two of the three resistors included in feedback resistors. Note that the aforementioned embodiments may be applied to the output stage 23.

The output stage 23 of the sensor detection circuit in FIG. 11 has the same functions and advantages as those of the aforementioned embodiments.

Figure 12:
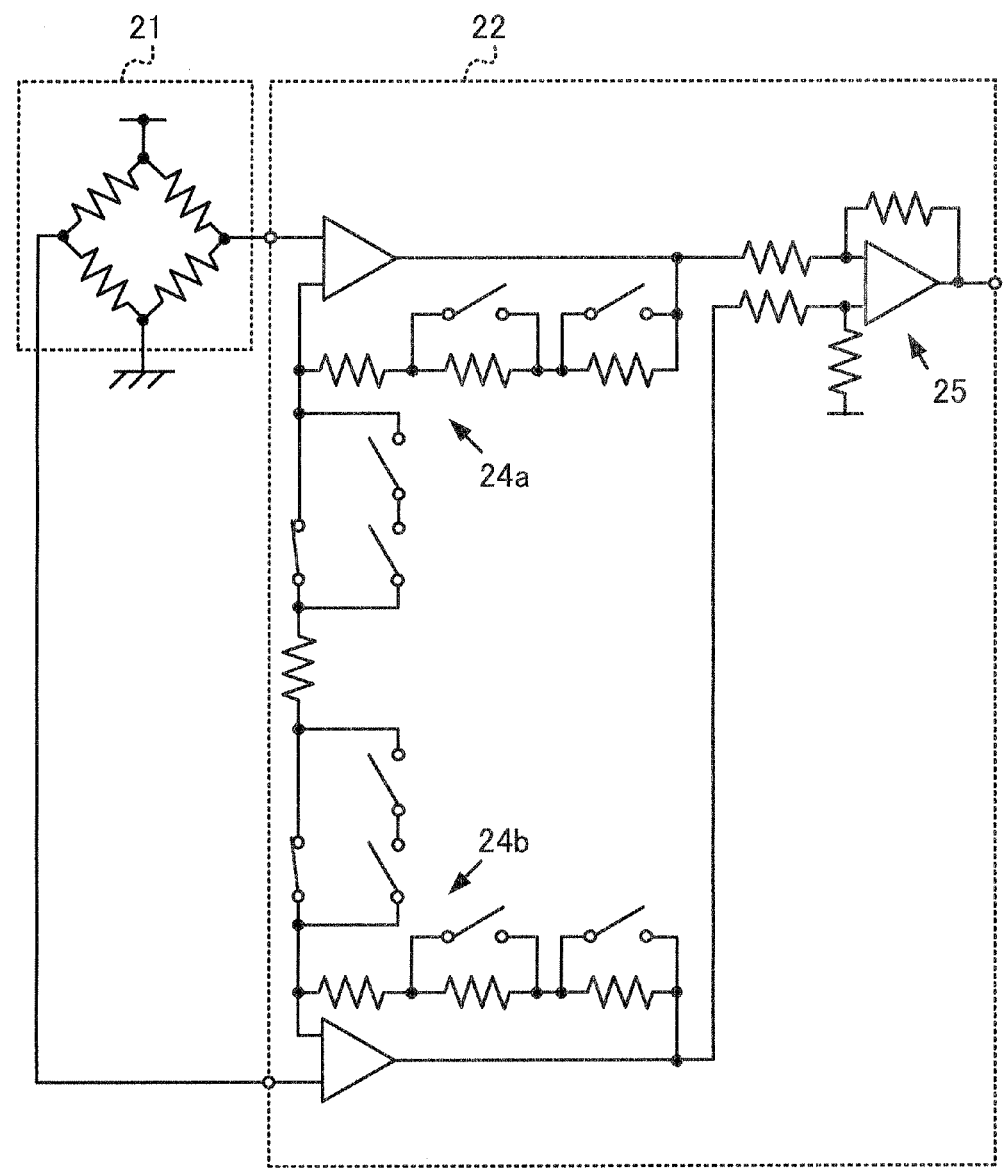
FIG. 12 illustrates a fifth embodiment.

FIG. 12 illustrates a fifth embodiment. In the fifth embodiment, a programmable gain circuit is used for a differential amplification stage 22 in the sensor detection circuit that does not require an output stage.

As shown in FIG. 12, a differential output signal from a sensor element 21 is inputted to a pair of differential inputs 24a and 24b of the differential amplification stage 22, respectively.

An output circuit 25 amplifies output signals from each of the pairs of differential inputs 24a and 24b, and the output signals are outputted.

As further shown in FIG. 12, the programmable gain circuit having the same configuration as the fourth embodiment is used for the pair of differential inputs 24a and 24b. The aforementioned embodiments may be applied to the pair of differential inputs 24a and 24b. The differential amplification stage 22 of the sensor detection circuit in FIG. 12 has the same functions and advantages as those of the aforementioned embodiments.

The aforementioned embodiments may be modified in view of the following aspects. For example, the number of feedback resistors to which the switching circuits may be coupled in parallel may be four or more.

For example, the ratios of resistance values of the feedback resistors to which switching circuits are coupled in parallel may be arbitrary ratios other than 1 to 2 to 4 (1:2:4).

At least one of the aforementioned embodiments provides a programmable gain circuit capable of increasing the number of selectable choices of the gain and capable of precisely adjusting the gain.

According to at least one of the aforementioned embodiments, a programmable gain circuit capable of increasing the number of selectable choices of the gain and capable of precisely adjusting the gain may be provided.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

Although aforementioned embodiments have been shown and described, it would be appreciated by those skilled in the art that changes may be made in these embodiments without departing from the principles and spirit of the invention, the scope of which is defined in the claims and their equivalents.

Numbers applying to embodiments (first, second or third etc.) do not show priorities of the embodiments. Many variations and modifications will be apparent to those skilled in the art.

What is claimed is:

1. A programmable gain circuit comprising:
    an amplification unit amplifying an input signal;
    an input resistor coupled to an input terminal of the amplification unit;

a feedback resistor coupled between an output terminal of the amplification unit and the input terminal of the amplification unit;

a first switch switching a resistance value of the feedback resistor;

a second switch switching a resistance value of the input resistor;

a control unit controlling the second switch such that the second switch switches the resistance value of the input resistor when the first switch switches the resistance value of the feedback resistor;

a plurality of resistors coupled in series with each other as the feedback resistor;

a plurality of the first switches corresponding to each of the plurality of the resistors and coupled in parallel thereto; and a group of switches including a plurality of the second switches coupled between the input terminal of the amplification unit and the input resistor canceling an ON-resistance of the first switch, wherein the plurality of the second switches are selected such that the ON-resistance of the selected first switch is canceled, wherein the first switch is coupled in parallel to the feedback resistor, and wherein the second switch is coupled between the input resistor and the input terminal of the amplification unit.

2. The programmable gain circuit according to claim 1, wherein a ratio of an ON-resistance of the first switch to an ON-resistance of the second switch is substantially equal to a ratio of the resistance value of the input resistor to the resistance value of the feedback resistor.

3. The programmable gain circuit according to claim 1, wherein the control unit causes a same number of the second switches as a number of first switching circuits brought into conductive states by switching control of the plurality of the first switches to become conductive in series between the input resistor and the input terminal.

4. The programmable gain circuit according to claim 1, further comprising:
a plurality of the input resistors,
wherein switching circuits are respectively coupled between the plurality of the input resistors and the amplification unit and one input resistor is selected by the switching circuits.

5. The programmable gain circuit according to claim 1, further comprising:
a plurality of the input resistors,
wherein the second switch selects one or more of the input resistors and couples the selected input resistor to the input terminal of the amplification unit,
wherein the first switch is coupled in series to the feedback resistor and brought into a constant conductive state.

6. The programmable gain circuit according to claim 1, wherein a total resistance value of the plurality of the feedback resistors to which the first switches are coupled in parallel is substantially equal to a value proportional to a power of two.

7. A sensor comprising:
a sensor element; and
an amplification circuit amplifying an output signal from the sensor element, wherein the amplification circuit comprises:
an amplification unit amplifying the output signal;
an input resistor coupled to an input terminal of the amplification unit;
a feedback resistor coupled between an output terminal of the amplification unit and the input terminal of the amplification unit;
a first switch switching a resistance value of the feedback resistor;
a second switch switching a resistance value of the input resistor;
a control unit controlling the second switch such that the second switch switches the resistance value of the input resistor when the first switch switches the resistance value of the feedback resistor,
a plurality of resistors coupled in series with each other as the feedback resistor;
a plurality of the first switches corresponding to each of the plurality of the resistors and coupled in parallel thereto; and
a group of switches including a plurality of the second switches coupled between the input terminal of the amplification unit and the input resistor canceling an ON-resistance of the first switch,
wherein the plurality of the second switches are selected such that the ON-resistance of the selected first switch is canceled,
wherein the first switch is coupled in parallel to the feedback resistor, and
wherein the second switch is coupled between the input resistor and the input terminal of the amplification unit.

8. An amplifier comprising:
a differential amplification circuit; and
an amplification circuit coupled to an input of the differential amplification unit, wherein the amplification circuit comprises:
an amplification unit amplifying an output signal;
an input resistor coupled to an input terminal of the amplification unit;
a feedback resistor coupled between an output terminal of the amplification unit and the input terminal of the amplification unit;
a first switch switching a resistance value of the feedback resistor;
a second switch switching a resistance value of the input resistor;
a control unit controlling the second switch such that the second switch switches the resistance value of the input resistor when the first switch switches the resistance value of the feedback resistor,
a plurality of resistors coupled in series with each other as the feedback resistor;
a plurality of the first switches corresponding to each of the plurality of the resistors and coupled in parallel thereto; and
a group of switches including a plurality of the second switches coupled between the input terminal of the amplification unit and the input resistor canceling an ON-resistance of the first switch,
wherein the plurality of the second switches are selected such that the ON-resistance of the selected first switch is canceled,
wherein the first switch is coupled in parallel to the feedback resistor, and
wherein the second switch is coupled between the input resistor and the input terminal of the amplification unit.

* * * * *